United States Patent [19]

Jigour et al.

[11] Patent Number: 5,046,035
[45] Date of Patent: * Sep. 3, 1991

[54] HIGH-PERFORMANCE USER PROGRAMMABLE LOGIC DEVICE (PLD)

[75] Inventors: Robin J. Jigour, San Jose; Shueh-Mien J. Lee, Sunnyvale; Ali Pourkeramati, Santa Clara, all of Calif.

[73] Assignee: ICT International CMOS Tech., Inc., San Jose, Calif.

[*] Notice: The portion of the term of this patent subsequent to Apr. 17, 2007 has been disclaimed.

[21] Appl. No.: 487,022

[22] Filed: Feb. 28, 1990

Related U.S. Application Data

[63] Continuation-in-part of Ser. No. 89,644, Aug. 26, 1987, Pat. No. 4,918,641.

[51] Int. Cl.[5] ........................ G06F 7/38; H03K 19/173
[52] U.S. Cl. ..................................... 364/716; 307/465; 340/825.3
[58] Field of Search .................... 364/716; 340/825.83, 340/825.84, 825.87; 365/94; 307/465

[56] References Cited

U.S. PATENT DOCUMENTS

| | | | |
|---|---|---|---|
| 3,803,587 | 4/1974 | Mead | 364/716 |
| 4,609,986 | 9/1986 | Hartmann et al. | 364/716 |
| 4,742,252 | 5/1988 | Agrawal | 364/716 |
| 4,771,285 | 9/1988 | Agrawal et al. | 340/825.83 |
| 4,783,606 | 11/1988 | Goetting | 307/465 |
| 4,876,640 | 10/1989 | Shankar et al. | 364/716 |
| 4,903,223 | 2/1990 | Norman et al. | 364/716 |
| 4,912,342 | 3/1990 | Wong et al. | 307/465 |
| 4,933,897 | 6/1990 | Shankar et al. | 307/465 |

OTHER PUBLICATIONS

Roth, Jr., *Fundamentals of Logic Design*, pp. 194-199, 1979, West Publishing Co., St. Paul, Minn.

Primary Examiner—Dale M. Shaw
Attorney, Agent, or Firm—Henry K. Woodward

[57] ABSTRACT

A programmable logic device having greater design flexibility through use of a plurality of programmable macrocells in conjunction with programmable gate arrays. Each macrocell includes a programmable reconfigurable register for receiving sum terms from the array, and an I/O terminal connected to receive an output from the programmable reconfigurable register. Two separate feedbacks from the macrocell to the gate array are provided. The first feedback has multiple inputs including the register output, and the second feedback has multiple inputs including the I/O terminal. Accordingly, the I/O terminal and the register can function independently. Each sum term is capable of serving multiple functions as determined by the programming of the macrocell whereby the input terms can be utilized to implememt two completely independent sum-of-product logic functions, both combinatorial and one combinatorial and one sequential, and whereby each is capable of being programmably routed as feedback to the array or as an output to the I/O terminal.

18 Claims, 8 Drawing Sheets

FIG.−1

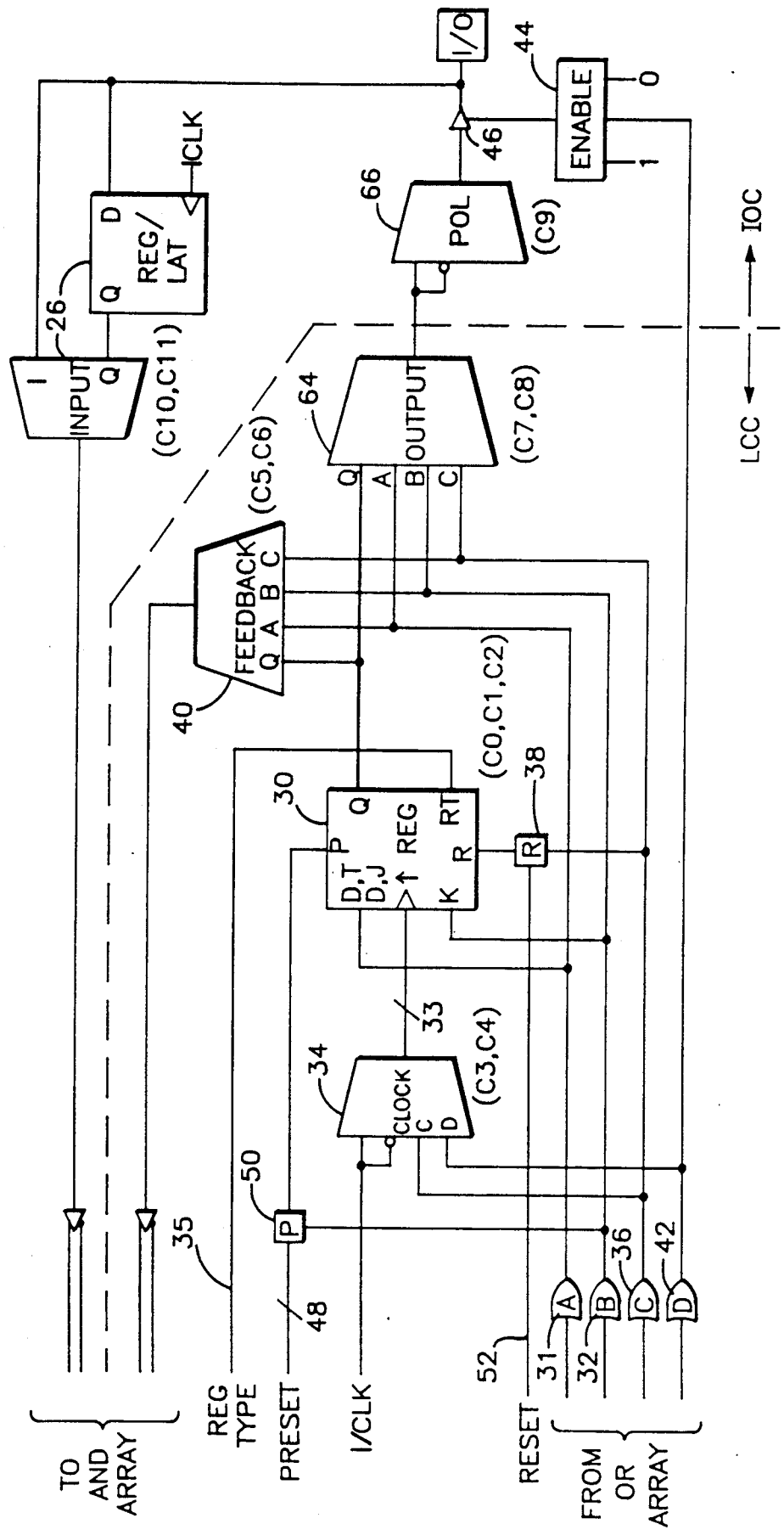
FIG.—7
SIMPLIFIED FUNCTIONAL BLOCK DIAGRAM OF MACRO CELL

HIGH-PERFORMANCE USER PROGRAMMABLE LOGIC DEVICE (PLD)

This application is a continuation-in-part of application Ser. No. 07,/089,644 filed Aug. 26, 1987, now U.S. Pat. No. 4,918,641.

BACKGROUND OF THE INVENTION

This invention relates generally to programmable logic devices (PLD), and more particularly the invention relates to a PLD having an efficient programmable macrocell structure which allows greater flexibility in operating on functions and thus higher performance and logic capabilities.

U S. Pat. No. 4,124,899 discloses a programmable array logic circuit in which an array of AND gates is connected to an array of OR gates with inputs to the AND gates being programmable to provide a desired logical output form the OR gates. The outputs from the OR gates can be connected through functionally limited macrocell output circuitry whereby OR outputs can be latched, fed back to the AND array, or connected to I/O pins. Additionally, the I/O pins can be utilized as inputs to the AND array.

More recently, a number of PLD's have been commercially available with both of the AND gate array and OR gate array being programmable, and in which the output macrocell has more versatility in handling data from the gate array, thereby increasing the logic capabilities of the devices. For example, the AMD PAL devices (based on the designs disclosed in U.S. Pat. No. 4,124,899, supra) incorporate multiple clock choices, a flexible output-enable, and feedback selection. The Exel XL8C800 device has dual synchronous and asynchronous logic paths, thereby allowing use of a JK flip-flop while the I/O pin is used as an asynchronous input or output. The ICT PEEL 18CV8 device has an output macro which consists of a D-type flip-flop and two signal selectors which allow twelve possible configurations for the macrocell.

Architectures of most conventional PLD structures that incorporate programmable output functions or I/O macrocells utilize one term that can generate a single sum-of-products function for an input to a register, as feedback to the array, and/or an output to an I/O pin. Other terms, typically product terms, are used to control a variety of I/O macrocell functions such as output-enable or register clock, preset or clear, but the terms are dedicated for a single function. None of the devices allows more than one term, capable of sum-of-products functions, to be programmed to serve multiple functions (i.e. register inputs, register controls, feedback or output). Most of the macrocells have programmable configuration bits which allow combinatorial or sequential functions to be implemented. However, a limiting factor with many of the devices is the inoperability of the entire sum-of-product function when the associated I/O pin of the macrocell is being used as a dedicated input. Some devices, such as the MMI 32VX10, have dual feedbacks that overcome the dedicated input issue, thereby allowing a sequential or combinatorial function to be fed back into the array without negating the use of the I/O pin. However, such devices do not provide output buried configurations within each I/O pin associated macrocell.

SUMMARY OF THE INVENTION

An object of the invention is a PLD having increased logic capabilities.

Another object of the invention is a PLD having an output macrocell structure which allows greater flexibility in operating on functions and thus higher performance.

Yet another object of the invention is an input/output macrocell which efficiently provides versatility and high performance.

Still another object of the invention is a PLD having greater access to and from internal nodes.

A feature of the invention is a PLD having multiple-function macrocell input signals.

Another feature of the invention is array feedback capability without negating the use of the I/O pin.

Still another feature of the invention is the provision of register type selection.

Another feature of the invention is variable clocking of the register and latches.

Yet another feature of the invention is the provision of dynamic architectural alterations.

Briefly, a programmable logic device in accordance with the invention has a plurality of inputs utilizing one or more programmable arrays for generating a plurality of programmable sum-of-products logic functions which are organized into term groups of two or more independent terms per I/O macrocell, with each term capable of serving multiple functions as determined by the programming of the I/O macrocell. Each I/O macrocell has the capability to feed back internally to the array of combinatorial or sequential functions, yet maintain its I/O pin for independent input and/or output functions. The macrocell input terms can be utilized to implement two completely independent sum-of-product logic functions, both combinatorial or one combinatorial and one sequential, of which each is capable of being programmably routed as feedback to the array and/or output to an I/O pin.

The PLD comprises a programmable AND array and a programmable OR array in sum-of-products form. Feeding from the OR array are a plurality of programmable macrocells. In a preferred embodiment, each macrocell consists of an input latch/register and a macro block or Logic Control Cell (LCC) that has four sum terms (Sum A, B, C and D) from the OR array feeding into it. Depending on how the macro block is configured (preferably via user-programmable EEPROM cells), the Sum terms can be used for a variety of functions such as inputs for a D register, a T register, a JK register, preset, reset, asynchronous register clock or direct combinatorial functions. The assignment of these functions per Sum is:

Sum-A = D, T, J, Sum-A

Sum-B = Preset, K, Sum-B

Sum-C = Reset, CLK, Sum-C

Sum-D = Output Enable, CLK

The macrocell allows routing of the registered or combinatorial signals back into the array as feedback and/or to the I/O pin. This flexibility allows two complete sum-of-product functions (either one registered and one combinatorial or both combinatorial) to be implemented within a single macrocell. Because of this capability and dual feedbacks, sum-of-product terms can be completely buried without sacrificing I/O pins for input or output operations. One feedback is provided internally to the array and one feedback is provided from the I/O pin through an input latch and register which can be clocked from external clocks or from a group product term. Multiplex selector means for the clocks includes clock polarity selection.

Control terms in the AND array and in the OR array control various functions within each macrocell including register preset, register clear, change register type, unload register to output, preload register to pin. Two external clocks/input pins are provided, and a macrocell group can use either of the external clocks. Further, each individual macrocell can select a polarity of a group clock. External global clocks are provided for high-speed synchronous operation; however, the versatile control functions of the macrocell allow for asynchronous clocking of macro block registers on an individual basis.

The invention and objects and features thereof will be more readily apparent from the following detailed description and appended claims when taken with the drawings.

BRIEF DESCRIPTION OF THE DRAWING

FIG. 7 is a simplified functional block diagram of a macrocell using the schematics of FIGS. 3, 4, and 5.

DETAILED DESCRIPTION OF ILLUSTRATIVE EMBODIMENTS

Figure 1:
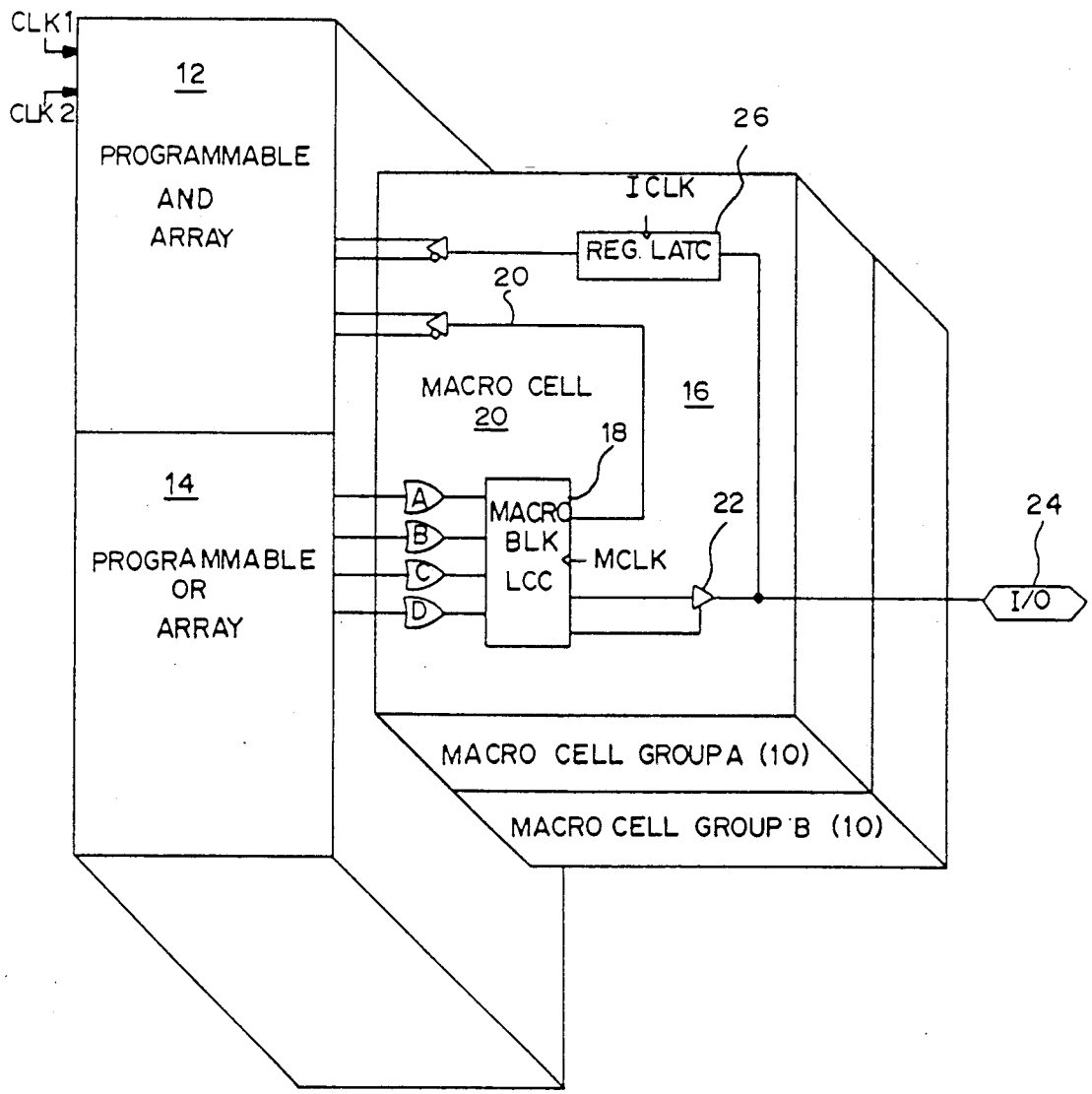
FIG. 1 is a functional block diagram of a programmable logic device in accordance with one embodiment of the invention.
Figure 2:
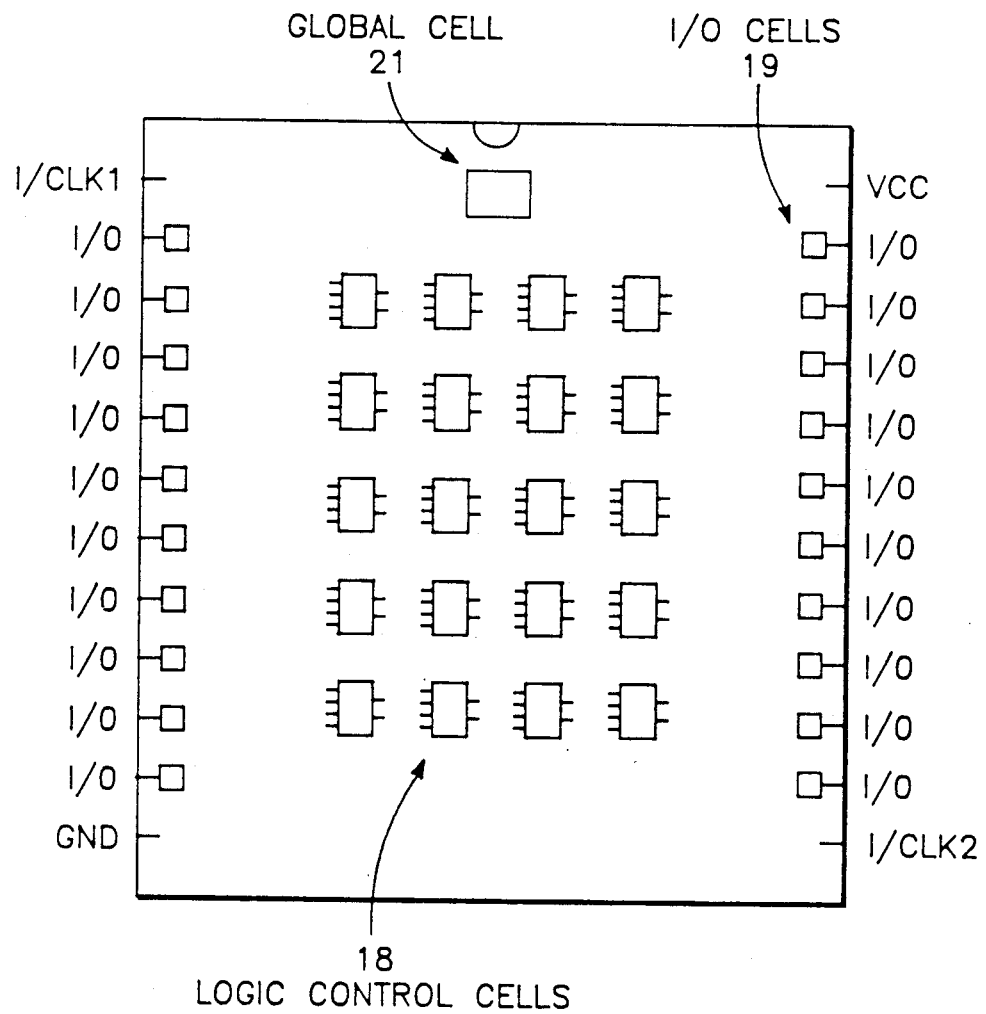
FIG. 2 is an illustration of pin designations for a macrocell group of FIG. 1.

FIG. 1 is a functional block diagram of one embodiment of a PLD in accordance with the invention. This PLD can be a CMOS programmable electrically-erasable logic device which is housed in a 24-pin package. As shown in FIG. 1, the PLD includes a programmable AND array 12 (84 input lines and 84 product terms), a programmable OR array 14 (80 product terms and 88 sum terms), and two groups of macrocells (Group A and Group B) having 20 I/O pins and two clock/input pins along with Vcc and ground pins. One macro cell group is illustrated in FIG. 2 and includes 20 macrocells or logic control cells (LCC) 18, twenty I/O cells 19, and one global cell 21 which provides system clock allocation and control functions for the LCCs and the IOCs. Each of the 20 I/O pins is connected to a macrocell group as shown in FIG. 1. Four sum terms A, B, C, D, are connected to a macro block or LCC 18 comprising a reconfigurable register, multiplexers, and control logic. Macro block 18 has a feedback path 20 to the programmable AND array 12, and through a programmable tristate selector 22 to an output pin 24. A second feedback loop to the programmable AND array 12 is provided through a clocked register latch 26 from the I/O pin. The illustrated device divides the macrocells into two groups, A, B, of ten macrocells each.

Figure 3:
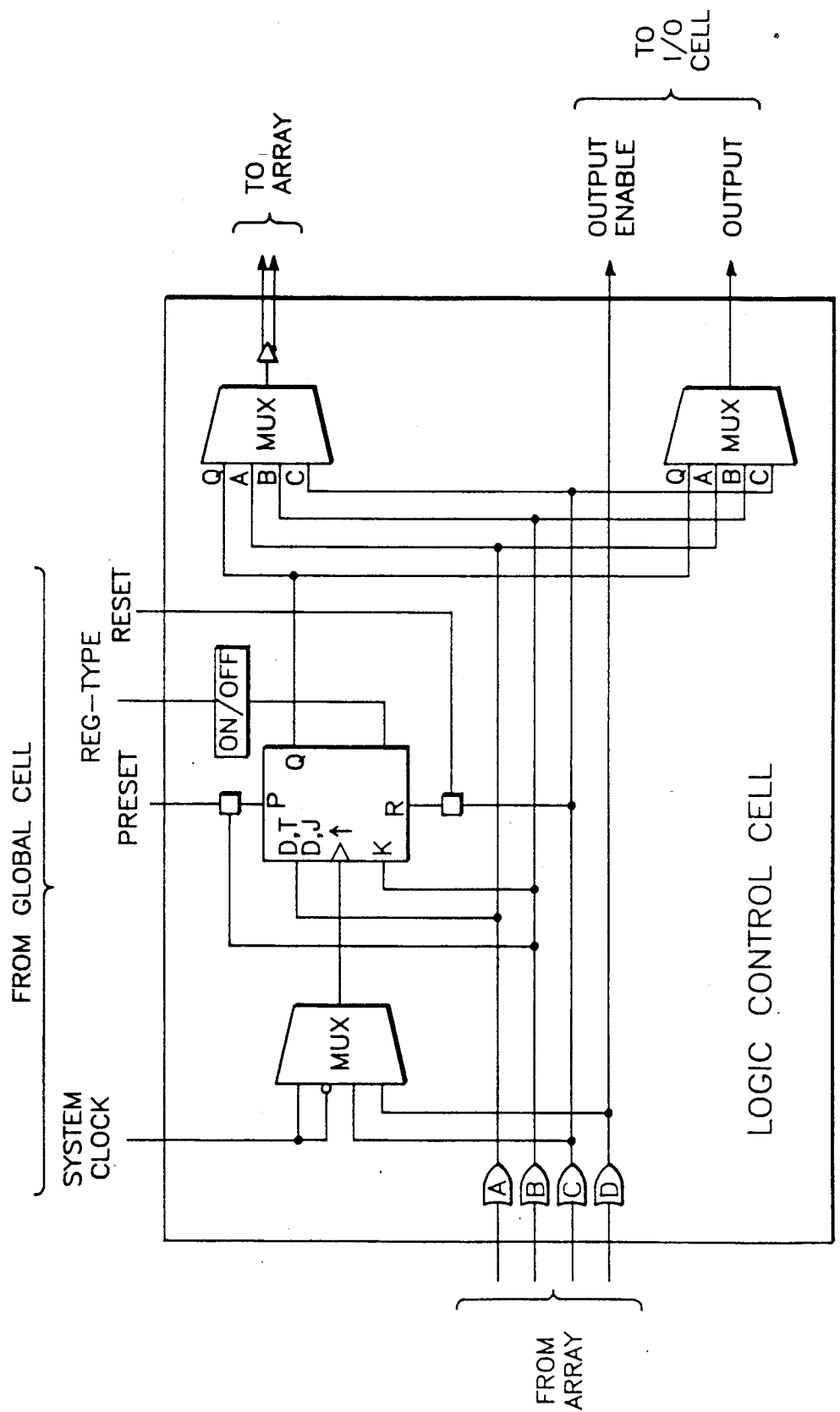
FIG. 3 is a functional diagram of a Logic Control Cell (LCC) as used in the device of FIG. 1.

FIG. 3 is a schematic diagram of a Logic Control Cell (LCC) used in the macrocell 16 of FIG. 1. The LCC includes three signal routing and control multiplexers, a versatile register with synchronous or asynchronous D, T or JK flip-flops, and several EEPROM memory cells for programming a desired configuration. The key elements of the LCC are illustrated in the LCC block diagram, FIG. 4. The diagram shows how the four LCC inputs (SUM terms A, B, C and D) are distributed into the cell and how each SUM term can be selectively used for multiple functions as listed below:

Sum-A = D, T, J or Sum-A

Sum-B = Preset, K or Sum-B

Sum-C = Reset, Clock, Sum-C

Sum-D = Clock, Output Enable, Sum-D

SUM-A can serve as the D, T, or J input of the register or a combinatorial path. SUM-B can serve as the K input or the preset to the register, or a combinatorial path. SUM-C can be the clock or the reset to the register, or a combinatorial path. And, SUM-D can be the clock to the register, or the output enable for the connected I/O cell. It is important to note that unlike many PLDs, the invention has complete sum-of-product (not just product term) control of clocks, resets, presets and output enables. The two primary outputs of the LCC can independently select the Q output from the register or the Sum A, B or C combinatorial paths. Thus, one LCC output can be combinatorial while the other is registered.

Besides the SUM inputs, several inputs from the Global Cell (FIG. 5) are provided for control. The Global Cell inputs are routed to all LCCs. These signals include a high speed clock of positive or negative polarity, global preset and reset, and a special register-type control that allows dynamic switching of register selection. This last feature is useful for implementing loadable counters and state machines by dynamically switching from D to T for instance.

Figure 4:
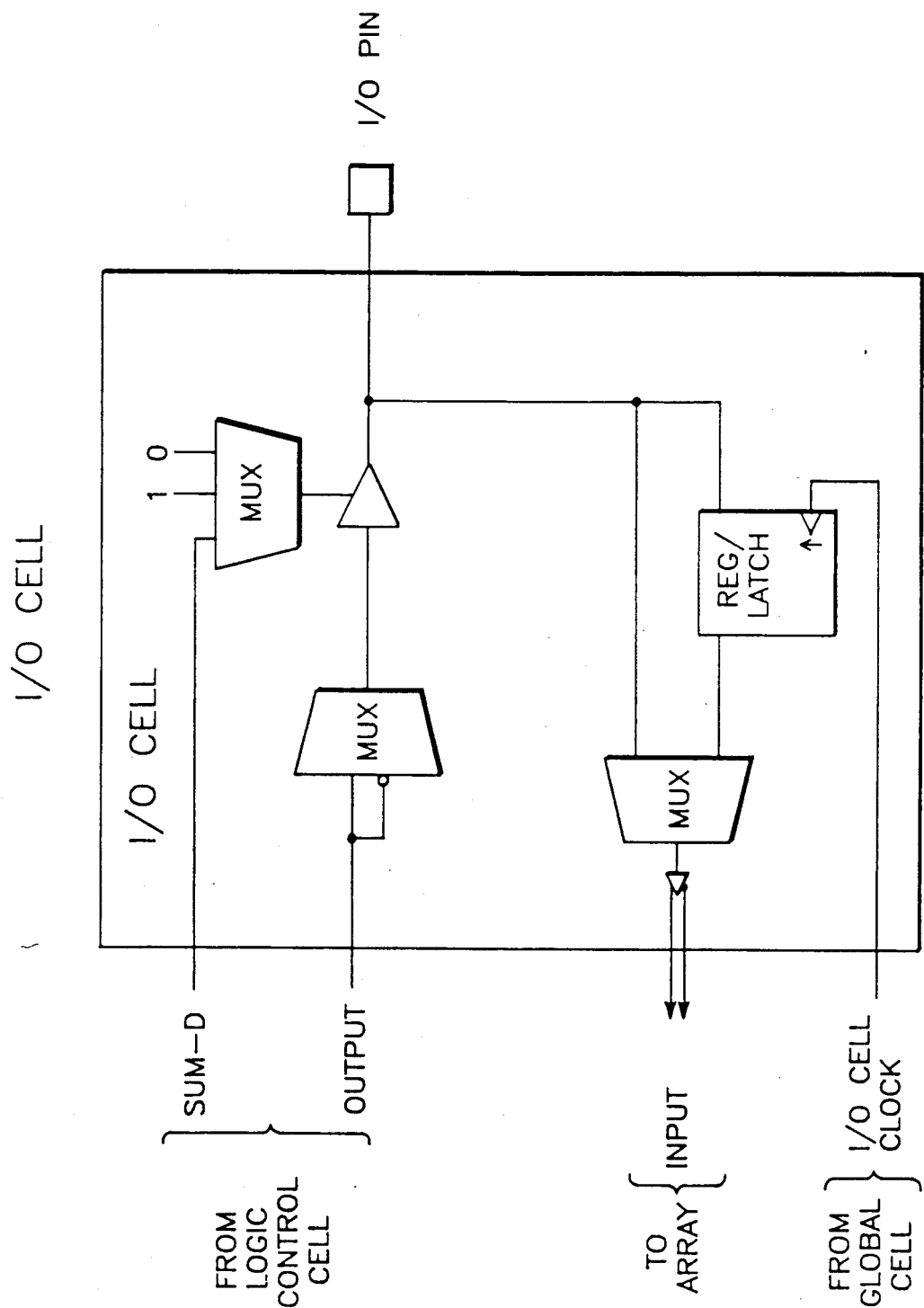
FIG. 4 is a functional diagram of an I/O cell (IOC) as used in the device of FIG. 1.

FIG. 4 is a schematic diagram of an I/O cell (IOC) used in the macrocell 16 of FIG. 1. The input to the IOC can be provided from any one of the LCCs in the array. Each IOC consists of routing and control multiplexers, an input register/transparent latch, a three-state buffer and an output polarity control. The reg/latch can be clocked from a variety of sources determined in the Global Cell. It can also be bypassed for a non-registered input.

Figure 5:
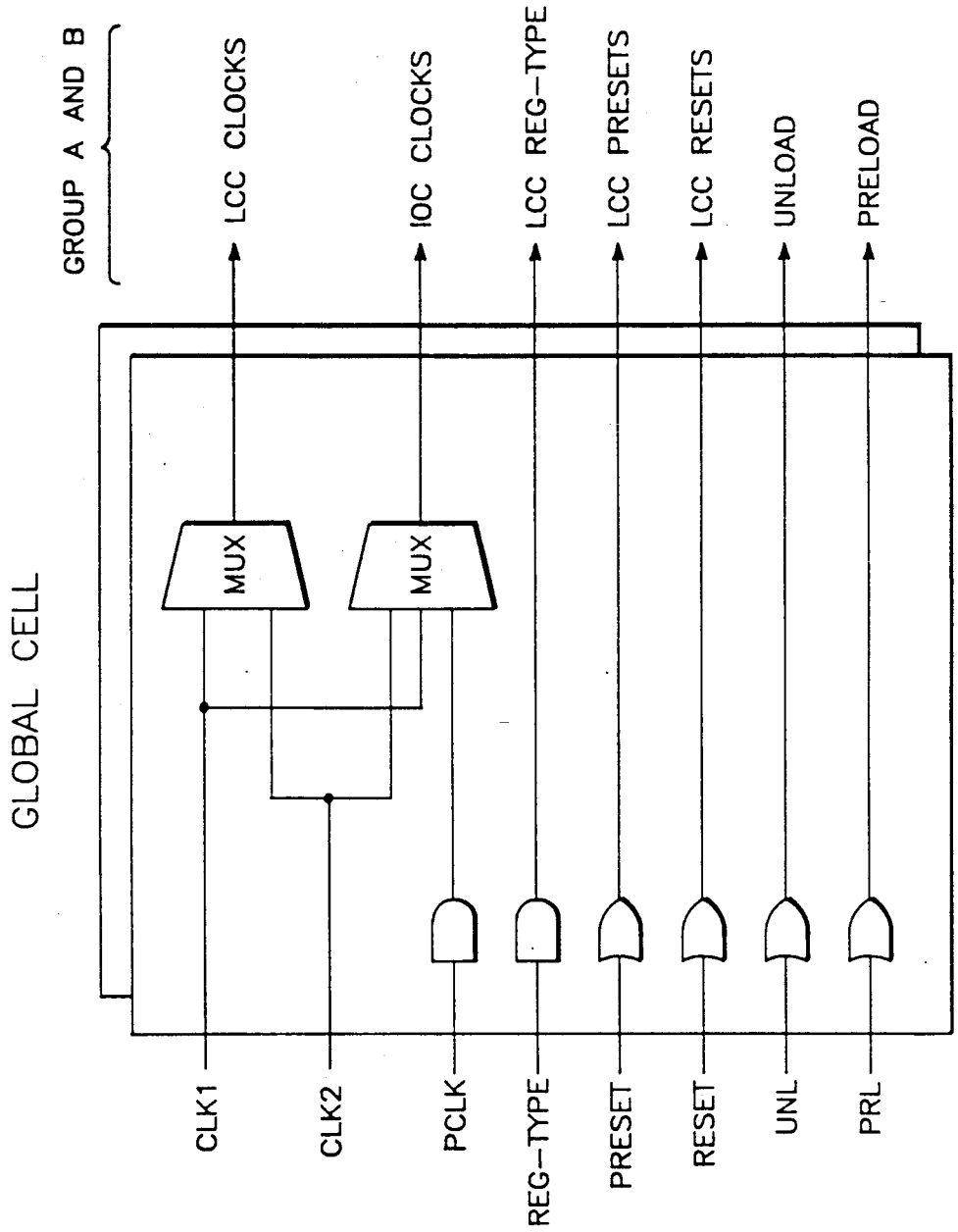
FIG. 5 is a functional diagram of a global cell as used in the device of FIG. 1.

FIG. 5 is a schematic diagram of a global cell used in a macro cell group in FIG. 1. The global cell is used primarily to control the allocation of the system clock signals to the LCCs and the IOCs. The global cell also contains several global product and sum control terms for LCC functions such as reset, preset, register type and IOC clock. If additional partitioning of global cell clocks and control terms is needed, a second global cell can be selected that allows the LCCs to be divided into two groups, A and B. That is, half of the LCCs can be controlled by Global Cell A and half with Global Cell B. This allows, for instance two high speed clocks to be used among the LCCs in the same PLD. Unless the second global cell is selected all LCCs and IOCs will be controlled by Global Cell A.

Figure 6A:
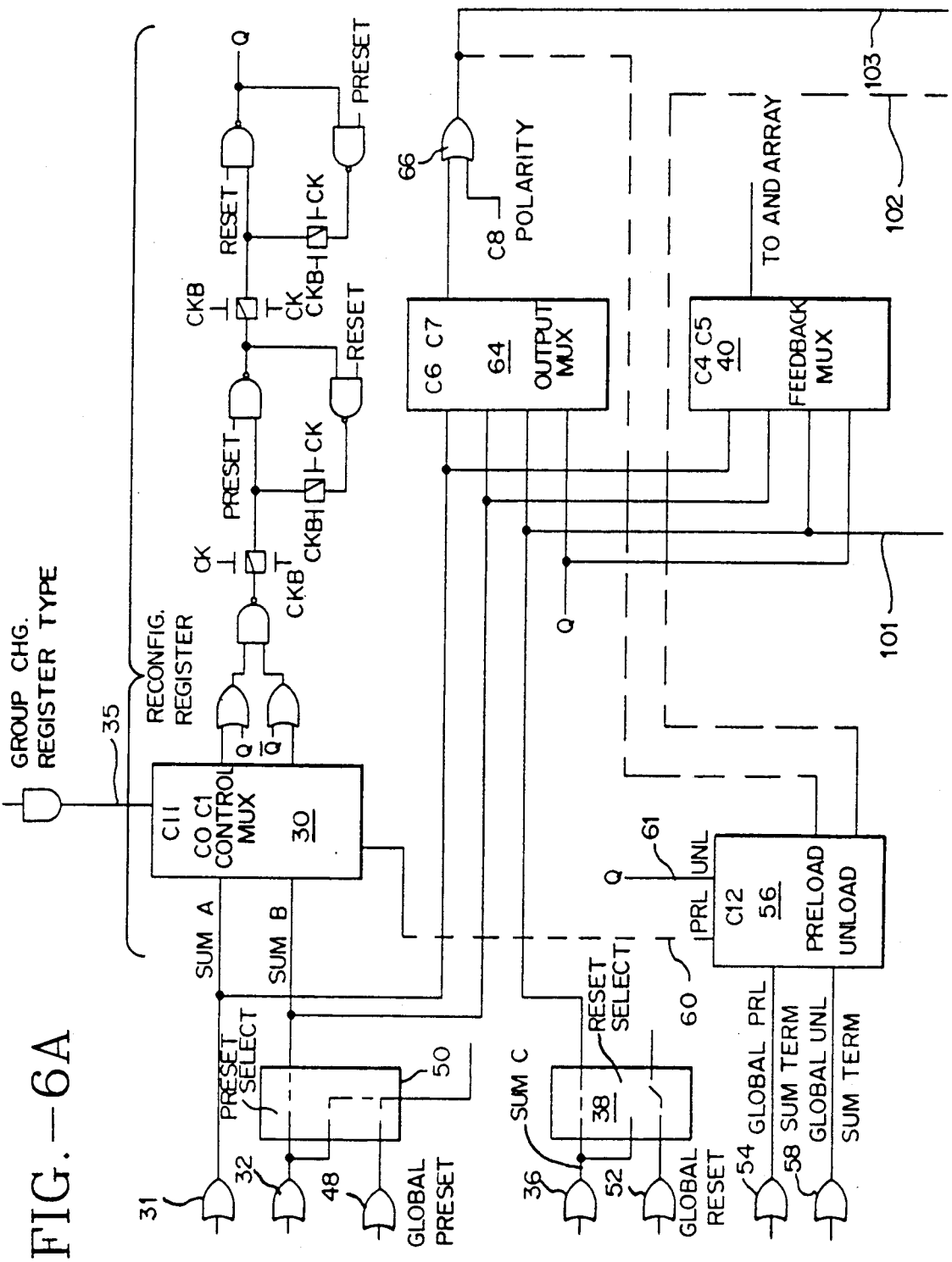
FIGS. 6A and 6B are a detailed functional block diagram of the macrocell used in the programmable logic device of FIG. 1.
Figure 6B:
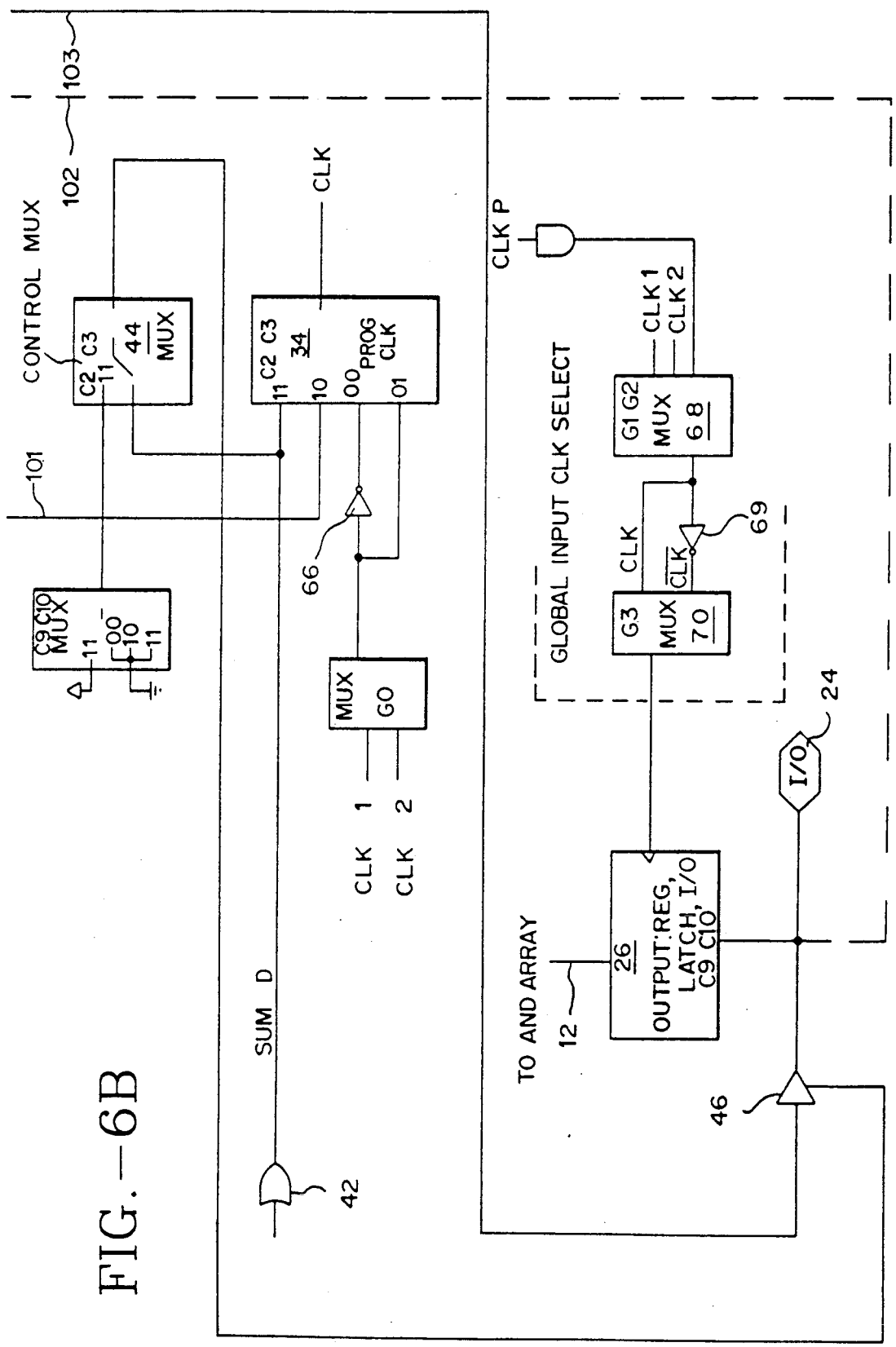

FIGS. 6A and 6B are a detailed functional block diagram of a macrocell 16 in FIG. 1. The macro block 18 includes a reconfigurable register including control MUX 30 which receives a Sum A input 31 and a Sum B input 32 along with a clock signal from a programmable clock 34. The Sum B input also functions as a preset signal. The Sum C input 36 is applied to a reset/select unit 38, to the clock unit 34, and to a feedback unit 40. The Sum D input 42 is applied as an input to the programmable clock unit 34 and to an input to the control unit 44 to the tristate device 46. A group change register type control signal is applied to the register through MUX 30 on line 35.

A global preset 48 is provided through a preset/select unit 50 to register 30, a global reset 52 is connected to the reset/select unit 38. A group preload sum-term is provided at 54 to a preload/unload unit 56 and a group unload sum term is provided at 58 through the preload-/unload unit 56. The preload/unload unit 56 is connected to register 30 via the broken lines 60 and 61. An output select unit 64 receives the output of register 30 along with the Sum A, Sum B, and Sum C input terms, and provides an output through polarity-select unit 66 to the tristate device 46. The Q output of register 30 also is applied to the feedback unit 40. A group clock (clock 1/clock 2) is applied to the clock unit 34 directly and through an invertor 66. The register 26 in the feedback loop to the programmable AND array 12 from the I/O pin 24 receives a clock signal (clock 1, clock 2, group product term) through the multiplex selectors 68 and 70. An invertor 69 allows mux 70 to select polarity of the clock signal.

FIG. 7 is a simplified block diagram of the macro cell using the schematics of FIGS. 3, 4, and 5. Like elements in FIGS. 6A, 6B and FIG. 7 have the same reference numerals. The dotted line separates the Logic Control Cell (LCC) from the I/O Cell (IOC).

The macrocell can be user-configured through programmable EEPROM cells so that the sum input terms can be used for a variety of functions such as inputs for a D register, a T register, a JK register, preset reset, asynchronous register clock or as direct combinatorial functions. Over 8,000 configurations per macrocell are possible. As noted above, the assignment of these functions per sum is shown below:

SUM-A = D, T, J, SUM-A

SUM-B = Preset, K, SUM-B

SUM-C = Reset, CLK, SUM-C

SUM-D = Output Enable, CLK

The macro clock allows routing of the registered or combinatorial signals back into the array (feedback) and/or to the I/O pin. The flexibility allows two complete sum-of-product functions (either one registered and one combinatorial or both combinatorial) to be implemented within a single macrocell. Because of this capability and dual feedbacks, up to 20 product functions can be completely buried without sacrificing I/O pins for input or output operations. Thus, a total of 40 sum-of-product logic functions can be implemented for feedback and output purposes.

As described above, the 20 I/O macrocells are segmented into two groups A, B of 10. Associated with each macrocell group are six control terms (two in the AND array and four in the OR array) that may control various functions within each macrocell. These functions include register preset, register clear, change register type, unload register to output, preload register from pin. An additional product term clock is available for input register/latch control.

Two external clocks/input pins are provided. Each macrocell group can use either of the external clocks. Each individual macrocell can select the polarity of the group clock. The external global clocks are provided for high-speed synchronous operations. However, the versatile control functions of the macrocell allow for asynchronous clocking of macro block registers on an individual basis.

The configuration of register 30 and control of the other units of the macrocell are determined by the user through 13 configuration bits (C0–C12), eight group (Global) configuration bits (G0–G7), a security bit (S1) and a power bit (Z1) which are selectively connected to the macrocell components in accordance with the following table:

| I/O MACROCELL CONFIGURATION BIT TABLE | |
|---|---|
| TERM FUNCTIONS | |
| SUM-A = | D, T, J, SUM-A |
| SUM-B = | Preset, K, SUM-B |
| SUM-C = | Reset, CLK, SUM-C |
| SUM-D = | Output Enable, CLK |
| C0 C1 | REG TYPE |
| 0  0 | D Reg (reset = SUM-C and preset = SUM-B) |
| 0  1 | D Reg (reset = SUM-C and preset = SUM-B) |
| 1  0 | T Reg (reset = SUM-C and preset = SUM-B) |
| 1  1 | JK Reg (reset = SUM-C and preset = group preset) |
| C2 C3 | CLOCK SELECT |
| 0  0 | GROUP CLK Inverted |
| 0  1 | GROUP CLK Non-inverted |
| 1  0 | SUM-C (reset = group reset) |
| 1  1 | SUM-D (OE set by I/O type selection)* |
| C4 C5 | FEEDBACK SELECT |
| 0  0 | Reg |
| 0  1 | SUM-A |
| 1  0 | SUM-B (preset = group preset) |
| 1  1 | SUM-C (reset = group reset) |
| C6 C7 | OUTPUT SELECT |
| 0  0 | REG |
| 0  1 | SUM-A |
| 1  0 | SUM-B (preset = group preset) |
| 1  1 | SUM-C (reset = group reset) |
| C8 | OUTPUT POLARITY |
| 0 | Inverted |
| 1 | Non-inverted |
| C9 C10 | I/O TYPE |
| 0  0 | I/O |
| 0  1 | I/O with Input Latch |
| 1  0 | I/O with Input Reg |
| 1  1 | Dedicated output |
| C11 | CHANGE REGISTER CONTROL |
| 0 | ON |
| 1 | OFF |
| C12 | PRELOAD/UNLOAD CONTROL |
| 0 | ON |
| 1 | OFF |
| G0 | GROUP A - MACRO CLOCK |
| 0 | CLK1 |
| 1 | CLK2 |
| G1 G2 | GROUP A - INPUT CLOCK |
| 0  0 | CLK1 |
| 0  1 | CLK2 |
| 1  0 | PCLK-A |
| G3 | GROUP A - INPUT CLOCK POLARITY |
| 0 | Inverted |
| 1 | Non-inverted |
| G4 | GROUP B - MACRO CLOCK |

-continued

| | |
|---|---|
| 0 | CLK1 |
| 1 | CLK2 |
| G5 G6 | GROUP B - INPUT CLOCK |
| 0 0 | CLK1 |
| 0 1 | CLK2 |
| 1 0 | PCLK-B |
| G7 | GROUP B - INPUT CLOCK POLARITY |
| 0 | Inverted |
| 1 | Non-inverted |
| SECURITY AND ZERO-POWER BIT TABLE | |
| S1 | SECURITY |
| 0 | On |
| 1 | Off |
| Z1 | ZERO POWER |
| 0 | On |
| 1 | Off |

*If SUM-D = CLK, I/O = input only unless set as dedicated output.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. A user programmable logic device comprising
a user programmable AND gate array having inputs for receiving input signals and generating a plurality of product terms,
a user programmable OR gate array connected to receive product terms from said AND gate array and producing sum terms of products, said individual sum terms from said OR gate array serving multiple functions based upon programming of said macrocell,
a plurality of user programmable macrocells each connected to receive a plurality of said sum terms from said user programmable OR gate array, each macrocell including
a first user programmable register means for receiving sum terms,
and I/O terminal means connected to receive outputs from said user programmable register means,
a first feedback from said register means to said AND gate array, and
a second feedback from said I/O terminal to said AND gate array wherein said register means and said I/O terminal means can function independently, each macrocell being functional in simultaneously implementing two independent sum-of-product logic functions combinatorially and sequentially with each of said logic functions being programmably routed as feedback signals to said AND gate array or as an output to an I/O terminal.

2. The user programmable logic device as defined by claim 1 and further including clock circuit means for said register means responsive to an external clock or a sum term.

3. The device as defined by claim 1 wherein said plurality of macrocells is organized into two cell groups, each cell group responding to group control signals including group preload, group unload, and group clock.

4. The user programmable logic device as defined by claim 1 wherein said user programmable register means is configurable as either a D flip-flop, or a T flip-flop, or a JK flip-flop.

5. The user programmable logic device as defined by claim 4 wherein said user programmable register means is dynamically alterable during circuit operation for individually controlled macrocells.

6. A user programmable logic device comprising
a user programmable AND gate array having inputs for receiving input signals and generating a plurality of product terms,
a user programmable OR gate array connected to receive product terms from said AND gate array and producing sum terms of products, individual sum terms from said OR gate array serve multiple functions based upon programming of said macrocell,
a first sum term is used as an input to a flip-flop, a second sum term is used as a preset signal and as an input to a flip-flop, a third sum term is used as a reset signal and as a clock signal, and a fourth sum term is used as an output-enable and as a clock signal,
a plurality of user programmable macrocells each connected to receive a plurality of said sum terms from said user programmable OR gate array each macrocell including
a first user programmable register means for receiving sum terms and configurable as either a D flip-flop, or a T flip-flop, or a JK flip-flop, said user programmable register means is dynamically alterable during circuit operation for individually controlled macrocells,
an I/O terminal means connected to receive outputs from said user programmable register means,
a first feedback from said register means to said AND gate array,
a second feedback from said I/O terminal to said AND gate array wherein said register means and said I/O terminal means can function independently, each macrocell being functional in simultaneously implementing two independent sum-of-product logic functions combinatorially and sequentially with each of said logic functions being programmably routed as feedback signals to said AND gate array or as an output to an I/O terminal, and clock circuit means for said register means responsive to an external clock or a sum term.

7. The user programmable logic device as defined by claim 6 and further including second register means connected to said I/O terminal means and wherein said I/O terminal means is responsive to an output-enable control signal to function as a latched input to said AND gate array, a register input to said AND gate array, a dedicated output, and as an I/O terminal with no register or latch.

8. The user programmable logic device as defined by claim 7 and further including means for preloading and unloading said user programmable register means.

9. The user programmable logic device comprising
a user programmable AND gate array having inputs for receiving input signals and generating a plurality of product terms,
a user programmable OR gate array connected to receive product terms from said AND gate array and producing sum terms of products, said user programmable register means being configurable as either a D flip-flop, or a T flip-flop, or a JK flip-flop, and wherein a first sum term is operable as an input to a flip-flop, a second term is operable as a preset signal and as an input to a flip-flop, a third sum term is operable as a reset signal and as a clock signal, and a fourth sum term is operable as an output-enable and as a clock signal, a plurality of user programmable macrocells each connected to receive a plurality of said sum terms from said user programmable OR gate array each macrocell including a first user programmable register means for receiving sum terms, an I/O terminal means connected to receive outputs from said user programmable register means, a first feedback from said register means to said AND gate array, a second feedback from said I/O terminal to said AND gate array wherein said register means and said I/O terminal means can function independently, each macrocell being functional in simultaneously implementing two independent sum-of-product logic functions combinatorially and sequentially with each of said logic functions being programmably routed as feedback signals to said AND gate array or as an output to an I/O terminal, and clock circuit means responsive to an external clock and to a sum term.

10. The user programmable logic device as defined by claim 9 and further including second register means connected with said I/O terminal means and wherein said I/O terminal means is responsive to an output-enable control signal to function as a latched input to said AND gate array, a registered input to said AND gate array, a dedicated output, and an I/O terminal with no register or latch.

11. For use in a user programmable logic device in which a gate array produces product sum terms, a macrocell comprising a user programmable register means for receiving a plurality of sum terms, an I/O terminal means connected to receive an output from said user programmable register means and connected to receive sum terms, a first feedback from said register means to said gate array, and a second feedback from said I/O terminal to said gate array wherein said user programmable register means and said I/O terminal means can function independently, each macrocell being functional in simultaneously implementing two independent sum-of-product logic functional combinatorially and sequentially with each of said logic functions being programmably routed as feedback signals to said gate array or as an output to an I/O terminal, and sum terms from the gate array serve multiple functions based on programming of said macrocell.

12. The macrocell as defined by claim 11 wherein said user programmable register means is configurable as either a D flip-flop, or a T flip-flop, or a JK flip-flop.

13. The macrocell as defined by claim 12 wherein said user programmable register means is dynamically alterable for individually controlled macrocells.

14. For use in a user programmable logic device in which a gate array produces product sum terms, a macrocell comprising user programmable register means for receiving a plurality of sum terms, said user programmable register means being configurable as either a D flip-flop, or a T flip-flop, or a JK flip-flop, said user programmable register means being dynamically alterable for individually controlled macrocells and serving multiple functions based on programming of said macrocell, a first sum term is used as an input to a flip-flop, a second sum term is used as a preset signal and as an input to a flip-flop, a third sum term is used as a reset signal and as a clock signal, and a fourth sum term is used as an output-enable and as a clock signal, an I/O terminal means connected to receive an output from said user programmable register means and connected to receive sum terms, a first feedback from said register means to said gate array, and a second feedback from said I/O terminal to said gate array wherein said user programmable register means and said I/O terminal means can function independently, each macrocell being functional in simultaneously implementing two independent sum-of-product logic functional combinatorially and sequentially with each of said logic functions being programmably routed as feedback signals to said gate array or as an output to an I/O terminal.

15. The macrocell as defined by claim 14 and further including a second register means connected to said I/O terminal means and wherein said I/O terminal means is responsive to an output-enable control signal to function as a latched input to said gate array, a registered input to said gate array, a dedicated output, and an I/O terminal with no register or latch.

16. The macrocell as defined by claim 15 and further including means for preloading and unloading said user programmable register means.

17. The macrocell as defined in claim 14 and further including a clock circuit means for said register means responsive to an external clock for to a sum term.

18. The macrocell as defined by claim 17 and further including means for inverting the polarity of clock pulses.

* * * * *